US012805370B2

(12) United States Patent
Yeh et al.

(10) Patent No.: US 12,805,370 B2
(45) Date of Patent: Nov. 17, 2026

(54) SEMICONDUCTOR PACKAGING METHOD AND SEMICONDUCTOR PACKAGING STRUCTURE

(71) Applicant: TONG HSING ELECTRONIC INDUSTRIES, LTD., Taoyuan City (TW)

(72) Inventors: Hung-Hsiang Yeh, Taoyuan City (TW); Jia-Yi Wu, Taoyuan City (TW)

(73) Assignee: TONG HSING ELECTRONIC INDUSTRIES, LTD., Taoyuan City (TW)

( * ) Notice: Subject to any disclaimer, the term of this patent is extended or adjusted under 35 U.S.C. 154(b) by 305 days.

(21) Appl. No.: 18/792,567

(22) Filed: Aug. 2, 2024

(65) Prior Publication Data

US 2025/0266392 A1 Aug. 21, 2025

Related U.S. Application Data

(60) Provisional application No. 63/555,112, filed on Feb. 19, 2024.

(30) Foreign Application Priority Data

Jun. 4, 2024 (TW) ................................ 113120645

(51) Int. Cl.
*H10W 90/00* (2026.01)
*H10W 72/00* (2026.01)
(Continued)

(52) U.S. Cl.
CPC ......... *H10W 72/075* (2026.01); *H10W 72/50* (2026.01); *H10D 12/411* (2025.01);
(Continued)

(58) Field of Classification Search
CPC . H10W 42/405; H10W 20/43; H10W 74/012; H10W 74/15; H10W 72/5473; H10W 90/20; H10W 90/732; H10W 90/754; H10W 72/354; H10W 72/877; H10W 72/884; H10W 72/931; H10W 90/271; H10W 90/724; H10W 42/40; H10W 72/075; H10W 72/50; H10W 70/60; H10W 72/07531; H10W 72/536; H10W 72/5524; H10W 72/5525; H10W 72/952; H10W 90/751; H10W 72/0711; H10W 90/00–811; H10W 90/10–297;
(Continued)

(56) References Cited

U.S. PATENT DOCUMENTS

2019/0293923 A1* 9/2019 Ghahremani ......... B81B 7/0067
2023/0361071 A1 11/2023 Zinn

FOREIGN PATENT DOCUMENTS

TW 201935632 9/2019

* cited by examiner

*Primary Examiner* — Moin M Rahman
(74) *Attorney, Agent, or Firm* — Winston Hsu

(57) ABSTRACT

The invention provides a semiconductor packaging method, which comprises the following steps: providing a chip, providing a wire to be placed above a first connection pad of the chip, and performing a solder ball jetting step, wherein a first solder ball is jetted onto the chip and electrically connected with the first connection pad of the chip, wherein the first solder ball contacts the wire, but the wire does not directly contact a surface of the first connection pad of the chip.

12 Claims, 6 Drawing Sheets

(51) Int. Cl.

| | |
|---|---|
| ***H10W 72/50*** | (2026.01) |
| *H10D 12/00* | (2025.01) |
| *H10D 30/60* | (2025.01) |
| *H10W 70/60* | (2026.01) |
| *H10W 72/90* | (2026.01) |

(52) U.S. Cl.
CPC ............. *H10D 30/60* (2025.01); *H10W 70/60* (2026.01); *H10W 72/07531* (2026.01); *H10W 72/536* (2026.01); *H10W 72/5524* (2026.01); *H10W 72/5525* (2026.01); *H10W 72/90* (2026.01); *H10W 72/952* (2026.01); *H10W 90/00* (2026.01); *H10W 90/751* (2026.01)

(58) Field of Classification Search
CPC . H10W 72/30–387; H10W 80/00–754; H10W 72/90–987; H10W 72/019–0198; H10W 90/791–798; H10W 72/20–287; H10W 72/012–01271; H10W 72/072–07261; H10W 72/07251–07255; H10W 90/721–7295; H10W 72/013–01371; H10W 72/073–07355; H10W 72/07351–07355; H10W 90/731–739; H10W 72/701–709; H10W 72/077; H10W 72/812; H10W 72/823; H10W 70/40–481; H04L 9/002; H10D 12/411; H10D 30/60; H10D 62/121; H10D 30/024; H10D 30/62; H10D 30/6735; H10D 30/794; H10D 30/797; H10D 62/115; H10D 62/151; H10D 62/292; H10D 62/822; H10D 64/017; H10D 64/021; H10D 64/257; H10D 64/62; H10D 30/014; H10D 30/0323; H10D 30/43; H10D 30/6744; H10D 30/6757; H10D 64/251; H10D 62/116; H10D 62/364; H10B 53/20; H10B 41/20–27; H10B 43/20–27; H10B 51/20; H10B 63/84–845; H10B 80/00; H01L 21/02532; H01L 21/02603; H01L 21/28568; H01L 21/30604; H01L 25/105; H01L 21/30625; H01L 21/6835; H10P 10/00–14; H10N 30/072–073; H10K 71/50
See application file for complete search history.

SEMICONDUCTOR PACKAGING METHOD AND SEMICONDUCTOR PACKAGING STRUCTURE

CROSS REFERENCE TO RELATED APPLICATIONS

This application claims the benefit of U.S. Provisional Application No. 63/555,112, filed on Feb. 19, 2024. The content of the application is incorporated herein by reference.

BACKGROUND OF THE INVENTION

1. Field of the Invention

The invention relates to the field of semiconductor packaging, in particular to a semiconductor packaging method for wire bonding by using solder ball jetting technology and a formed structure thereof.

2. Description of the Prior Art

In recent years, with the rapid development of electronic products and the continuous progress of chip technology, the size and density of chips have increased significantly, which puts forward higher requirements for bonding technology. Stability and reliability become the key factors in the design and manufacture of high power components. The traditional direct wire bonding technology on aluminum pads has been difficult to meet the needs of modern high-power components because it produces a lot of wire bonding stress under the requirements of high current density and long life. In order to solve this problem, the industry gradually pays attention to the ultrasonic copper wire bonding technology, which can better meet the challenges in high-power applications.

Compared with traditional aluminum wire bonding, ultrasonic copper wire bonding technology has higher electrical conductivity and thermal conductivity, which makes it superior in high current density and heat dissipation management. The mechanical strength of copper wire is also significantly higher than that of aluminum wire, which can bear greater stress and is not easy to break, which is particularly important in high power and high frequency applications. In addition, copper wire bonding technology can provide longer service life and further improve the performance and reliability of components. However, in the process of copper wire bonding, due to the high hardness of copper and the greater requirement for ultrasonic energy, if the chip is not specially treated, it will easily lead to chip crack, which becomes a big challenge in technical application.

SUMMARY OF THE INVENTION

The invention provides a semiconductor packaging structure, which comprises a chip, a first solder ball located on a surface of the chip, and a conductive element located in the first solder ball, wherein the conductive element directly contacts the first solder ball, but does not directly contact the surface of the chip.

The invention also provides a semiconductor packaging method, which comprises the following steps: providing a chip, providing a wire to be placed above a first connection pad of the chip, and performing a solder ball jetting step, wherein a first solder ball is jetted onto the chip and electrically connected with the first connection pad of the chip, wherein the first solder ball contacts the wire, but the wire does not directly contact a surface of the chip.

To sum up the above, the solder ball jetting technology used in the present invention, in which each solder ball is formed on the connection pad of the chip or substrate by jetting, has the following advantages compared with the wire bonding technology commonly used in the prior art, such as wedge bonding or using copper foil, copper clamp, etc.: 1. High precision and high reliability: because the solder ball jetting technology can realize micron-level material deposition, it ensures accurate connection position and consistent connection quality; 2. Non-contact with the chip: non-contact operation avoids ultrasonic waves and mechanical pressure, reduces the stress of solder joints and reduces the risk of component damage; 3. Better thermal management: the use of solder ball jetting technology can better control and manage the heat, and avoid the thermal stress caused by traditional welding. In addition, the improved thermal conductivity is helpful to the heat dissipation of power semiconductors and improve the overall performance and reliability; 4. Flexibility of materials: In addition to tin as raw material, solder ball jetting technology can also use various other conductive materials to meet different application requirements, especially suitable for using materials with high conductivity and high thermal stability to improve the performance of power semiconductors; 5. High-speed production: the solder ball jetting technology can quickly and accurately deposit materials, significantly improve production efficiency, be suitable for large-scale automatic production, and help reduce production costs; 6. Reduce contact pollution: non-contact operation reduces physical contact, reduces the risk of pollution and oxidation, and ensures the quality of welding points; 7. Adapt to complex structures: solder ball jetting technology can easily cope with complex connection structures and high-density packaging, and adapt to different design requirements, and output elasticity is better; 8. Simple steps: Because the steps of solder ball jetting connection, wire bonding and cutting are completed at one station in the manufacturing process, there is no need for printing, dispensing, welding and baking at multiple stations, which can greatly save the manufacturing time and complexity.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

In order to make the following easier to understand, readers can refer to the drawings and their detailed descriptions at the same time when reading the present invention. Through the specific embodiments in the present specification and referring to the corresponding drawings, the specific embodiments of the present invention will be explained in detail, and the working principle of the specific embodiments of the present invention will be expounded. In addition, for the sake of clarity, the features in the drawings may not be drawn to the actual scale, so the dimensions of some features in some drawings may be deliberately enlarged or reduced.

FIG. 1 to FIG. 4 show a flow diagram of bonding a wire on a chip and a substrate by a solder ball jetting step according to a preferred embodiment of the present invention, wherein:

FIG. 1 is a schematic cross-sectional view showing a first solder ball melted and ready to be jetted;

FIG. 2 shows a schematic cross-sectional structure of jetting a melted first solder ball onto a chip;

FIG. 3 is a schematic cross-sectional view showing a second solder ball melted and ready to be jetted;

FIG. 4 is a schematic cross-sectional view of jetting the melted first solder ball onto the chip.

DETAILED DESCRIPTION

Figure 1:
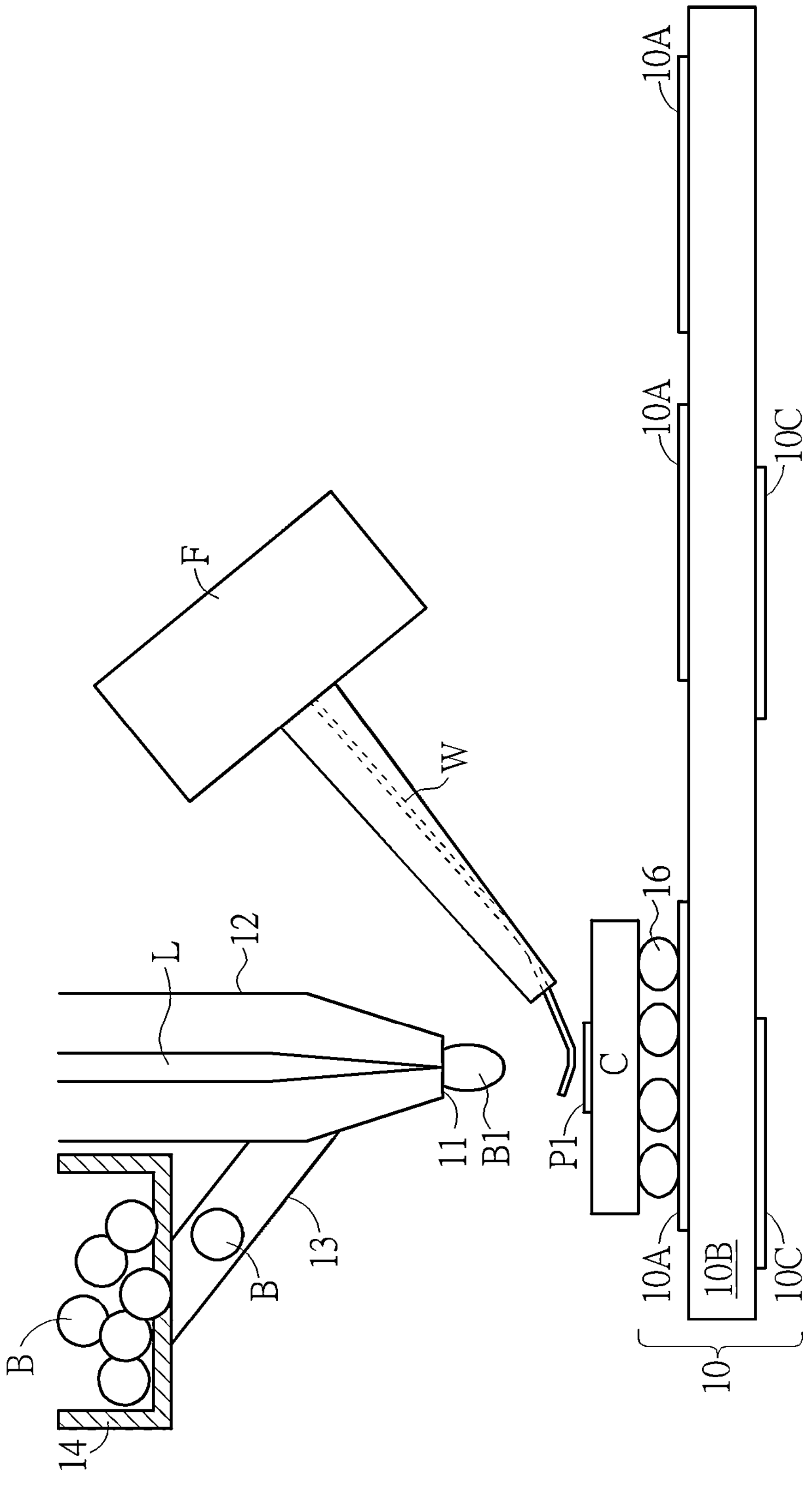

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Although the present invention uses the terms first, second, third, etc. to describe elements, components, regions, layers, and/or sections, it should be understood that such elements, components, regions, layers, and/or sections should not be limited by such terms. These terms are only used to distinguish one element, component, region, layer and/or block from another element, component, region, layer and/or block. They do not imply or represent any previous ordinal number of the element, nor do they represent the arrangement order of one element and another element, or the order of manufacturing methods. Therefore, the first element, component, region, layer or block discussed below can also be referred to as the second element, component, region, layer or block without departing from the specific embodiments of the present invention.

The term "about" or "substantially" mentioned in the present invention usually means within 20% of a given value or range, such as within 10%, or within 5%, or within 3%, or within 2%, or within 1%, or within 0.5%. It should be noted that the quantity provided in the specification is approximate, that is, the meaning of "about" or "substantially" can still be implied without specifying "about" or "substantially".

The terms "coupling" and "electrical connection" mentioned in the present invention include any direct and indirect means of electrical connection. For example, if the first component is described as being coupled to the second component, it means that the first component can be directly electrically connected to the second component, or indirectly electrically connected to the second component through other devices or connecting means.

Although the invention of the present invention is described below by specific embodiments, the inventive principles of the present invention can also be applied to other embodiments. In addition, in order not to obscure the spirit of the present invention, specific details are omitted, and the omitted details are within the knowledge of those with ordinary knowledge in the technical field.

The invention provides a semiconductor packaging method, in particular to a wire bonding method for a power semiconductor chip. Among them, power semiconductor chip is a semiconductor component specially designed to control and convert electric energy, which is widely used in power electronic equipment. For example, an insulated gate bipolar transistor (IGBT) chip or a metal oxide field effect transistor (MOSFET) chip. Generally speaking, the main characteristics of power semiconductor chips include high voltage and high current handling capacity, high efficiency, fast switching performance, good thermal management performance, high reliability and low EMI (electromagnetic interference). Therefore, power semiconductor chip plays an important role in power electronic equipment, and its characteristics make it a core component in modern power conversion and power management system. With the continuous progress of technology, the performance of these chips will be further improved and the application scope will be expanded.

The applicant found that in the conventional power semiconductor chip, wire bonding technology usually adopts aluminum wire and wedge bonding, that is, the aluminum wire contacts the chip, and then pressure and ultrasonic waves are applied to the aluminum wire to bond the aluminum wire to the chip. However, due to the high-frequency vibration and pressure applied in the bonding process, mechanical stress will be caused to the chip, which often leads to chip crack. Wafer fracture will not only affect the electrical properties of components, but also lead to the failure of the whole semiconductor component, thus affecting the reliability and life of products. Therefore, how to conduct reliable wire bonding synthesis without damaging the chip is a technical problem to be solved.

In addition, in the existing power semiconductor elements, besides wire bonding with aluminum wire, a method of electrical connection between elements with copper foil or copper clip has been developed. However, these alternatives face many challenges in design and manufacturing. First of all, from the design point of view, copper foil and copper clip need to consider the overall design of the product, including the replacement of the chip, the change of the chip mounting position and the thickness of different bonding layers. This means that every time the design changes, the corresponding copper foil and copper clip need to be redesigned, which leads to the high cost of the processes. In addition, the design of copper foil and copper clip needs to consider stricter geometric accuracy and mechanical strength to ensure that there will be no displacement or deformation during installation and operation, so as to maintain stable electrical connection.

From the process point of view, the application of copper foil and copper clip requires additional adhesive, such as solder, silver paste or sintered silver. These adhesives need extra processes, including printing, dispensing, flow welding or baking, which makes the whole process more lengthy and time-consuming. The increase of each process means the increase of manufacturing cost and the decrease of production efficiency. In addition, these additional process steps may also bring potential quality control problems, such as the uniformity, fluidity and curing performance of the adhesive, which will affect the performance and reliability of the final product.

From the point of view of mechanical strength, copper foil and copper clip are mostly sheet shape structures. Although the problem of wire breakage like aluminum wire or copper wire can be avoided, their mechanical strength mainly depends on the overall design of the product to reduce the risk of fracture or peeling caused by coefficient of thermal expansion (CTE) mismatch during stretching, compression and shearing. Especially in high-power applications, the mechanical stress caused by thermal cycling will have a significant impact on the stability of copper foil and copper clip, which requires designers to consider and verify the material selection and structural design more carefully. In addition, the thickness and shape of copper foil and copper clip will also affect their heat dissipation performance and electrical characteristics, which further increases the complexity of design and manufacture.

To sum up, although the electrical connection between power semiconductor components with copper foil or copper clip has certain advantages in some aspects, such as higher conductivity and better heat dissipation performance. However, its challenges in design, process and mechanical strength make its application have many limitations. The high cost of redesign and mold opening, lengthy and time-consuming process and mechanical strength problems caused by CTE mismatch are all key problems to be solved.

In view of this, the purpose of the present invention is to provide an improved semiconductor packaging method, which is mainly characterized in that the solder ball jetting technology is combined with a feeder to provide wires, and the wires are directly bonded to the connection pads on the chip or the substrate and cut in one station of the process, and the method of the present invention does not need to apply pressure and ultrasonic welding, so it will not cause stress damage to the chip. More detailed features are described in the following paragraphs:

Please refer to FIGS. 1 to 4. FIGS. 1 to 4 illustrate a flow diagram of bonding a wire on a chip and a substrate by a solder ball jetting step according to a preferred embodiment of the present invention. In which FIG. 1 shows a schematic cross-sectional structure of melting a first solder ball and preparing for jetting. As shown in FIG. 1, a chip C is provided, which is a power semiconductor chip, such as an insulated gate bipolar transistor (IGBT) chip or a metal oxide semiconductor field effect transistor (MOSFET) chip, and may also include bipolar transistors (BJT), Schottky diodes, power modules, power management IC, etc. There is a first connection pad P1 above the chip C. For example, the first connection pad P1 is an electroplated nickel/immersion gold (ENIG) pad, but the present invention is not limited to this. The first connection pad P1 may be connected to, for example, the terminal (such as gate, source or drain) of a transistor.

Next, a feeder F is used to provide a wire W to the first connection pad P1 above the chip C. The function of the feeder F is to provide the wire W stably and accurately, and the feeder F can be moved by the control system. In addition, after the wire W is bonded to the chip, the feeder F also has the function of cutting the wire W. Therefore, based on the above, the feeder F has the advantages of accurate feeding and truncation, accurate positioning, high-speed operation, high reliability and durability. It is worth noting that the wire W provided by the feeder F may not directly contact the surface of the chip C, that is, the wire W may not directly contact the first connection pad P1, but may keep a certain distance from the first connection pad P1. However, in other embodiments of the present invention, the wire W can touch the first connection pad P1, which is also within the scope of the present invention.

In addition, one of the characteristics of the present invention is to jet solder balls onto a chip or a substrate by using a solder ball jetting step and electrically connect with a wire W. More specifically, there is a jetting head 12 above the first connection pad P1. The jetting head 12 has a tubular structure, one end of which is an outlet 11, and the middle of the jetting head 12 is connected with a pipeline 13, which is connected with a storage tank 14. The storage tank 14 is used to store a plurality of solder balls B. The controller (not shown) can send the solder balls B in the storage tank 14 to the outlet 11 in the jetting head 12 through the pipeline 13, and then generate a laser L in the jetting head 12, which generates high heat and melts the solder balls B in a short time. In the following step, the melted solder ball B will be jetted on the chip C with compressed gas. Here, for the convenience of distinction, the solder ball that is expected to be jetted on the chip C is defined as the first solder ball B1 in FIG. 1 to distinguish it from other solder balls B in the storage tanks 14, but it can be understood that the material characteristics of the first solder ball B1 are the same as those of other solder balls B in the storage tanks 14.

Figure 2:
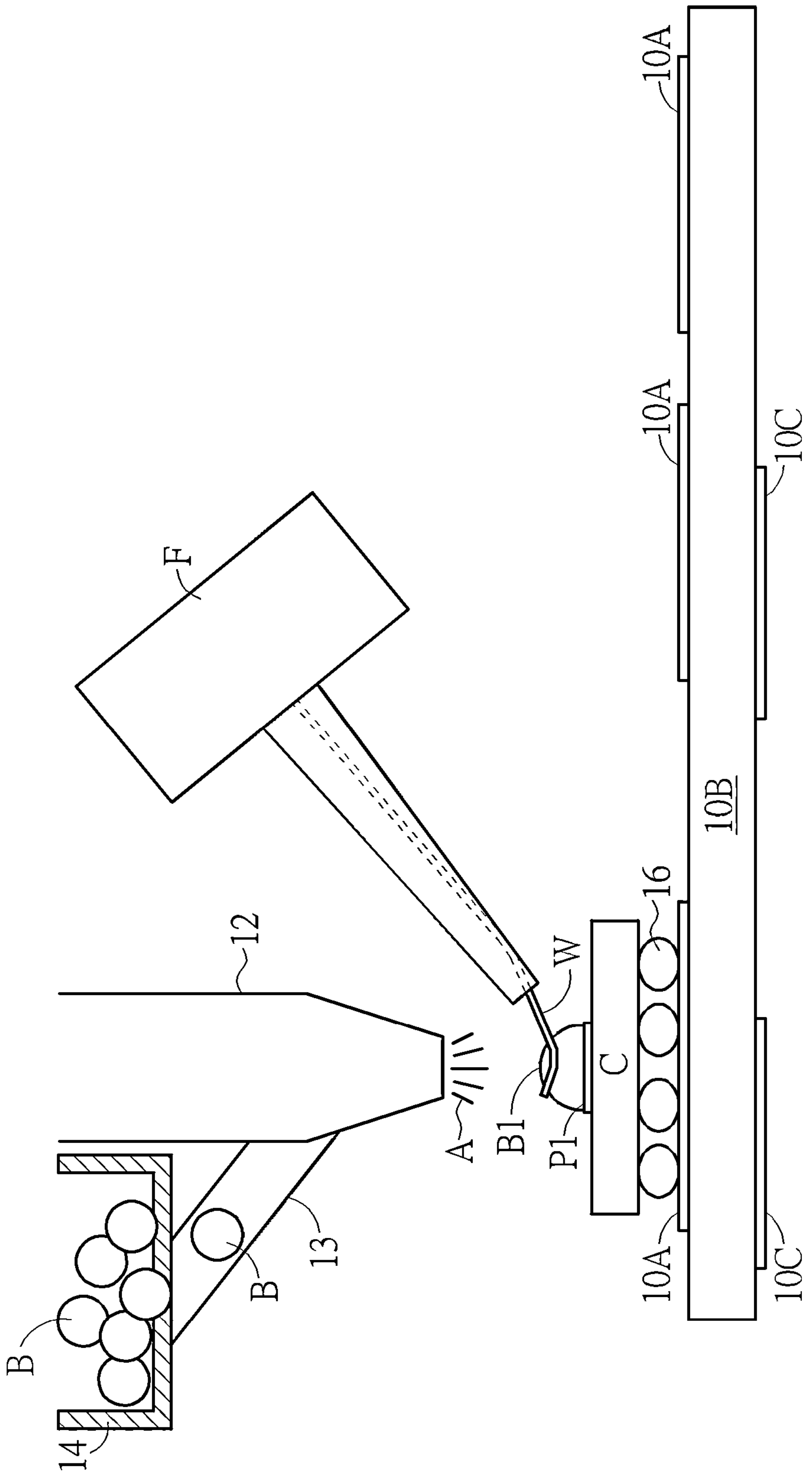

Please refer to FIG. 2, which shows the schematic cross-sectional structure of jetting the melted first solder ball onto the chip. As shown in FIG. 2, the melted first solder ball B1 is jetted with compressed gas A onto the first connection pad P1 of the chip C. The melted first solder ball B1 contacts the chip C and also surrounds the wire W, so that the wire W is connected with the first connection pad P1 through the first solder ball B1. It is worth noting that since the wire W is electrically connected with the first connection pad P1 by using the solder ball jetting technology, the wire W does not need to directly touch the surface of the first connection pad P1. In other words, since the wire W can be connected without directly contacting the first connection pad P1, the influence caused by the wire W touching the first connection pad P1 can be reduced.

In addition, it is preferable that when the first solder ball B1 is jetted, the ambient gas is filled with an inert gas, such as nitrogen ($N_2$), which helps to prevent oxidation, improve the welding quality and protect the chip. More specifically, wires are easily oxidized in the air to form an oxide film, which will reduce the conductivity and welding strength. Nitrogen is an inert gas, which can prevent the wire from oxidation and improve the welding quality. In addition, nitrogen can protect the chip from pollutants in the air, such as dust, moisture and organic matter, so as to improve the reliability of the chip.

In addition, as shown in FIGS. 1 and 2, the chip C is located on a substrate 10, wherein the substrate 10 can be a printed circuit board (PCB), an AMB (active metal brazing) substrate or a DPC (direct plated copper) substrate. The AMB substrate or DPC substrate includes a ceramic substrate (such as silicon nitride, aluminum nitride, aluminum oxide, etc.), and a conductive layer (such as copper foil) is included above the ceramic substrate as a circuit layer. Taking this embodiment as an example, the substrate 10 comprises a conductive layer 10A, a ceramic substrate 10B and a conductive layer 10C, wherein the conductive layer 10A and the conductive layer 10C are made of copper, for example, and are located on the front side and back side of the ceramic substrate 10B. The above-mentioned chip C may be formed on the substrate 10 by welding or the like. In FIG. 1 and FIG. 2, a plurality of solder balls 16 are included between the substrate 10 and the chip C. The solder balls 16 connect the chip C and a part of the conductive layer 10A of the substrate 10.

It is worth noting that the solder ball 16 here is different from the first solder ball B1 formed on the surface of the chip C in the way of formation. The solder balls 16 between the substrate 10 and the chip C may be formed by reflow soldering, wave soldering, ultrasonic welding or laser welding, but the manufacturing method does not include solder ball jetting. On the contrary, the first solder ball B1 is formed on the chip C by solder ball jetting, but its manufacturing method does not include other methods such as reflow soldering, wave soldering, ultrasonic welding or laser welding.

In other embodiments, the substrate 10 here can also be regarded as a lead frame. If the substrate 10 is a lead frame, it is not necessary to form solder balls 16 here, but the chip C can be connected to the contacts of the lead frame by wire bonding in the subsequent steps. This structure also falls within the scope of the present invention.

Figure 3:
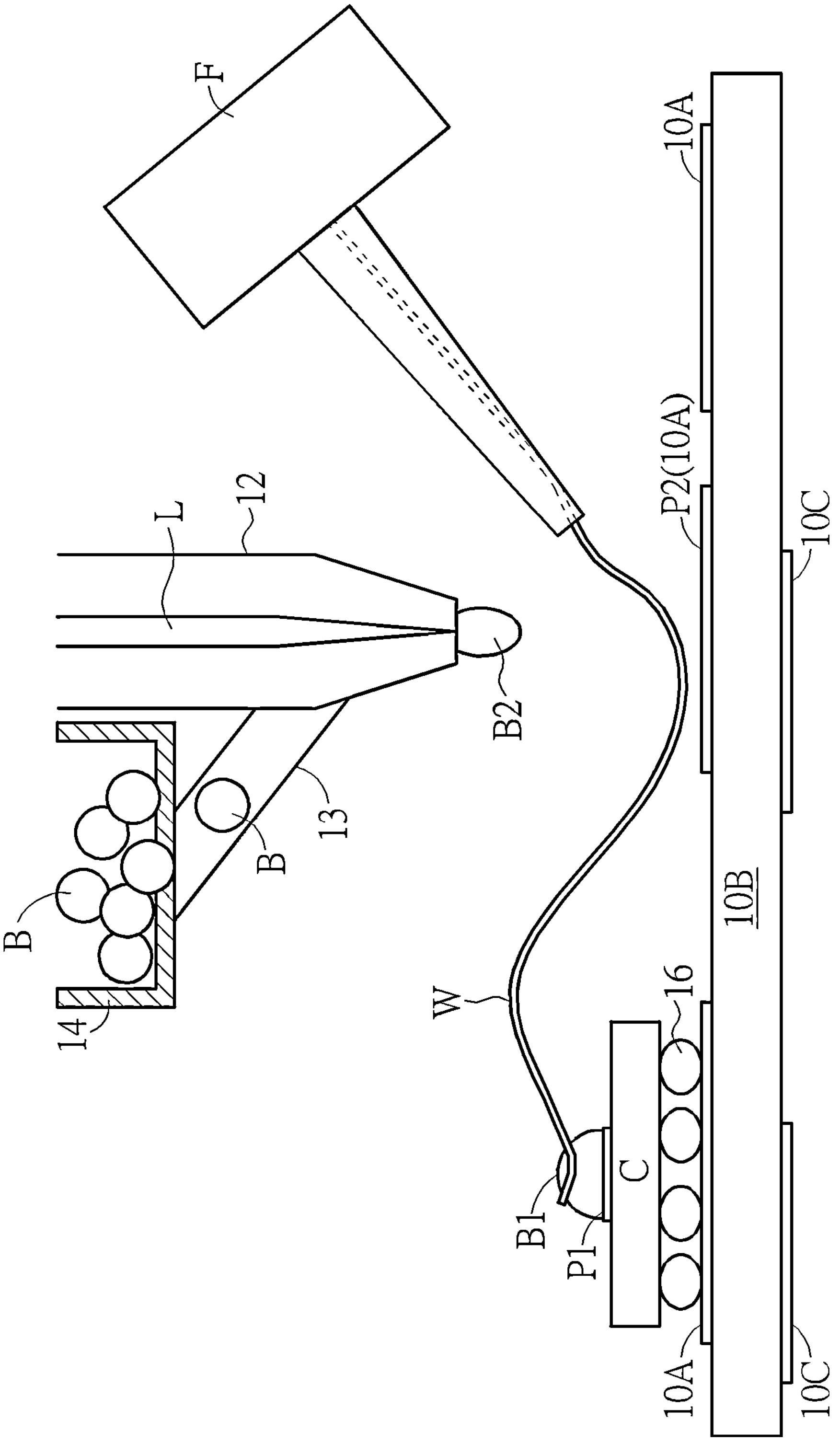

Subsequently, please continue to refer to FIG. 3 and FIG. 4. FIG. 3 shows the schematic cross-sectional structure of melting a second solder ball and preparing for jetting. After the bonding between the wire W and the first solder ball B1 is formed on the chip C, the feeder F is moved to another position, for example, to another position of the substrate 10, and the second connection pad P2 is included above it. The second connection pad P2 mentioned here may be one of the contacts of the conductive layer 10A on the substrate 10, or when the substrate 10 is a lead frame, the second connection pad P2 may be the contact of the lead frame. The feeder F moves to the side of the second connection pad P2, while continuously supplying the wire W, and pulls the other end of the wire W above the second connection pad P2. Here, the wire W may not directly contact the second connection pad P2, but keep a distance from the second connection pad P2. At the same time, the jetting head 12 also moves above the second connection pad P2, and another solder ball is sent to the outlet 11 of the jetting head 12, and the solder ball is heated and melted by the laser L. Here, for the convenience of distinction, the solder ball that is expected to be jetted on the second connection pad P2 is defined as the second solder ball B2 in FIG. 3 to distinguish it from others solder balls B in storage tanks 14 and the first solder ball B1, but it can be understood that the material characteristics of the second solder ball B2 are the same as those of the other solder balls B and the first solder ball B1 in the storage tanks 14.

Figure 4:
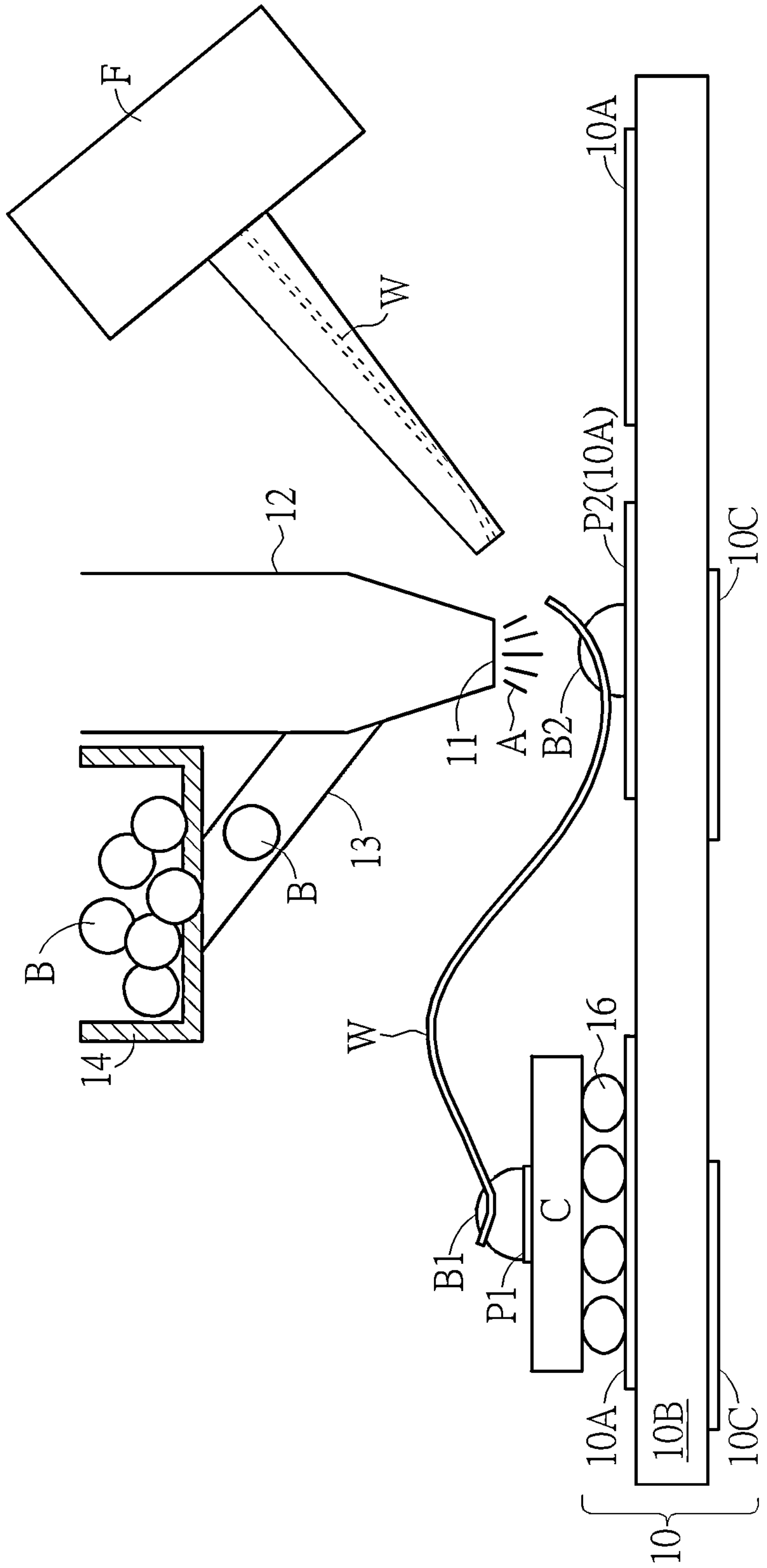

FIG. 4 is a schematic cross-sectional view of jetting the melted first solder ball onto the chip. As shown in FIG. 4, the melted second solder ball B2 is jetted on the second connection pad P2 with compressed gas A, so that the other end of the wire W is fixed and bonded on the second connection pad P2. In the same way as above, the melted second solder ball B2 contacts the second connection pad P2 and also surrounds the wire W, so that the wire W is connected to the second connection pad P2 through the second solder ball B2. It is worth noting that the wire W is electrically connected with the second connection pad P2 by using the solder ball jetting technology, so the wire W does not need to directly touch the surface of the second connection pad P2, and the influence caused by the wire W touching the second connection pad P2 can be reduced.

Subsequently, if it is necessary to connect the wire W to other contact pads (for example, to other chips or to other positions on the lead frame or substrate), the steps in FIG. 3 and FIG. 4 can be repeated, the wire W can be pulled to other positions, and the solder balls are jetted and bonded to the wire and the connection pads by means of solder ball jetting. In addition, if it is not necessary to connect the wire W to other positions, the wire W can also be cut by the feeder F, as shown in FIG. 4. Therefore, as shown in FIGS. 1 to 4 above, the steps including sending the wire to the chip or substrate by the feeder and connecting the wire with the chip or substrate by the solder ball jetting technology can all be completed at the same site in the semiconductor packaging process, so the method provided by the invention has the effects of reducing the process steps and simplifying the process.

Figure 5:
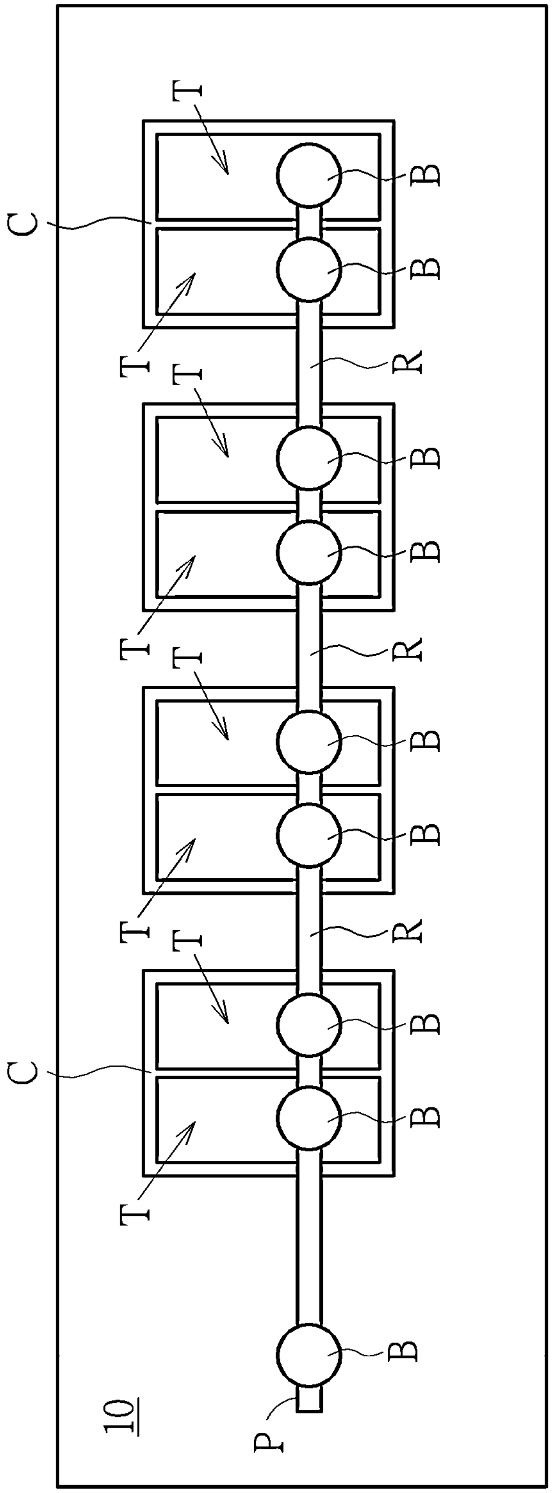
FIG. 5 is a schematic top view of a semiconductor package structure according to another embodiment of the present invention.
Figure 6:
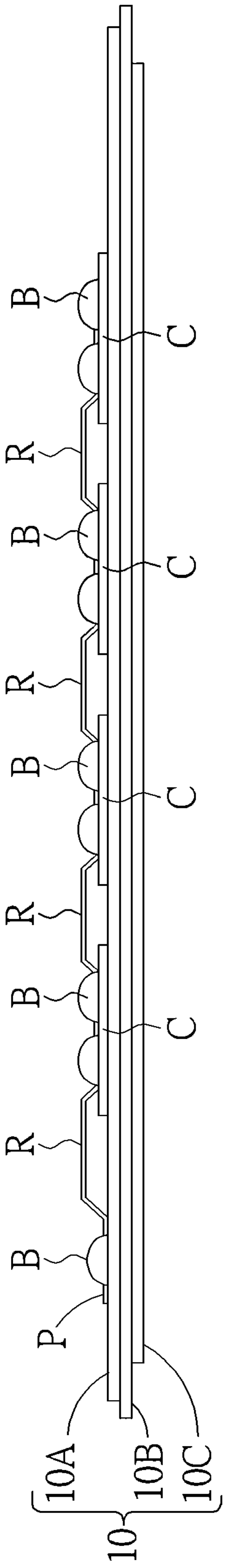
FIG. 6 is a schematic cross-sectional view of the semiconductor package structure of FIG. 5.

FIG. 5 shows a schematic top view of a semiconductor package structure according to another embodiment of the present invention, and FIG. 6 shows a schematic cross-sectional view of the semiconductor package structure of FIG. 5. Please refer to FIG. 5 and FIG. 6. In another embodiment of the present invention, the wire W may be made of other materials besides copper and aluminum, such as gold and silver. And that wire W may be replace by a conductive ribbon, and the conductive ribbon is also fixed on the chip or the substrate by sol ball jetting. As shown in FIG. 5, the substrate 10 includes a plurality of chips C, each of which includes electronic components, such as transistors T or other electronic components, and the present invention is not limited to this. Conductive ribbon R connects transistors T on multiple chips C and substrate 10. As shown in FIG. 6, the substrate 10 of this embodiment includes a ceramic circuit board, wherein the ceramic circuit board includes a conductive layer 10A and a conductive layer 10C formed on both sides of the ceramic substrate 10B. According to the method of forming the conductive layer 10A, the ceramic circuit board may include a printed circuit board (PCB), an AMB (active metal brazing) substrate, a DPC (direct plated copper) substrate, and a DBC (direct bonded copper) substrate.

As can be seen from FIGS. 5 and 6, the present invention is also applicable to the continuous wire bonding structure of multiple chips. That is, when the substrate 10 contains a plurality of chips C, continuous wire bonding can be performed by the method provided by the present invention. As described in the previous embodiment, the solder ball jetting technology does not need to apply ultrasonic waves and pressure to the surface of chip C, so it is not easy to damage the surface of chip C, which can improve the quality of semiconductor packaging structure. In addition, the combination of solder ball jetting technology and wire bonding can form a large number of solder ball connecting wire structures in a short time, which is helpful to improve the process speed.

Based on the above description and drawings, the present invention provides a semiconductor packaging structure (mainly refer to FIG. 4 or FIG. 6), which comprises a chip C, a first solder ball B1 located on a surface of the chip C, and a conductive element (such as a wire W) located in the first solder ball B1, wherein the conductive element W directly contacts the first solder ball B1, but does not directly contact the surface of the chip C.

In some embodiments of the present invention, the chip C is a power semiconductor chip, including an insulated gate bipolar transistor (IGBT) chip or a metal oxide semiconductor field effect transistor (MOSFET) chip.

In some embodiments of the present invention, the material of the conductive element (the wire W) includes copper or aluminum.

In some embodiments of the present invention, a substrate 10 is further included, and a chip C is located on the substrate 10.

In some embodiments of the present invention, the substrate 10 comprises a ceramic substrate 10B, and a conductive layer 10A is located on a front surface of the ceramic substrate 10B.

In some embodiments of the present invention, the chip C is electrically connected with a first part of the conductive layer 10A on the substrate 10 (i.e., referring to FIG. 4, the chip C is electrically connected with a part of the substrate 10 through solder balls 16).

In some embodiments of the present invention, a second solder ball B2 is further included, which is located on a second part (i.e., the second connection pad P2) of the conductive layer 10A on the substrate 10, wherein the conductive element W contacts the second solder ball B2, but does not contact the second part (the second connection pad P2) of the conductive layer 10A.

In some embodiments of the present invention, the conductive element W comprises a conductive wire or a conductive strip R (refer to FIG. 6).

The present invention also provides a semiconductor packaging method (please refer to FIGS. 1 to 4), which includes providing a chip C, providing a wire W above a first connection pad P1 of the chip C, and performing a solder ball jetting step to jet a first solder ball B1 onto the chip C and electrically connect with the first connection pad P1 of the chip C, wherein the first solder ball B1 contacts the wire W, but the wire W does not directly contact one of the chips C.

In some embodiments of the present invention, the solder ball jetting step includes providing a jetting head 12, wherein the jetting head 12 is located above the first connection pad P1, sending the first solder ball B1 to an outlet 11 of the jetting head 12, melting the first solder ball with a laser L, and jetting the melted first solder ball onto the chip with a compressed gas.

In some embodiments of the present invention, the melted first solder ball B1 is still in a molten state when jetted onto the chip C, and the wire W is surrounded by the molten first solder ball B1.

In some embodiments of the present invention, the wire W is provided by a feeder F.

In some embodiments of the present invention, after the first solder ball B1 is jetted on the chip C, one end of the wire W is fixed or bonded on the chip C (that is, after the first solder ball B1 is solidified again, one end of the wire W is fixed or bonded by the first solder ball B1).

In some embodiments of the present invention, a substrate 10 is further included, and a chip C is located on the substrate 10. After the first solder ball B1 is jetted on the chip C, the feeder F is moved, and the other end of the wire W is stopped at a second connection pad P2 of the substrate 10 (that is, another part of the conductive layer 10A).

In some embodiments of the present invention, after the feeder F moves, the jetting head 12 also moves above the second connection pad P2 of the substrate 10, and jets a second solder ball B2 to the second connection pad P2, and contacts the other end of the wire W with the second solder ball B2.

In some embodiments of the present invention, the wire W is cut off after the other end of the wire W contacts the second solder ball B2.

In some embodiments of the present invention, the semiconductor package does not include an ultrasonic wire bonding step.

In some embodiments of the present invention, the first connection pad P1 on the chip comprises an electroplated nickel/immersion gold pad.

To sum up the above, the solder ball jetting technology used in the present invention, in which each solder ball is formed on the connection pad of the chip or substrate by jetting, has the following advantages compared with the wire bonding technology commonly used in the prior art, such as wedge bonding or using copper foil, copper clamp, etc.: 1. High precision and high reliability: because the solder ball jetting technology can realize micron-level material deposition, it ensures accurate connection position and consistent connection quality; 2. Non-contact with the chip: non-contact operation avoids ultrasonic waves and mechanical pressure, reduces the stress of solder joints and reduces the risk of component damage; 3. Better thermal management: the use of solder ball jetting technology can better control and manage the heat, and avoid the thermal stress caused by traditional welding. In addition, the improved thermal conductivity is helpful to the heat dissipation of power semiconductors and improve the overall performance and reliability; 4. Flexibility of materials: In addition to tin as raw material, solder ball jetting technology can also use various other conductive materials to meet different application requirements, especially suitable for using materials with high conductivity and high thermal stability to improve the performance of power semiconductors; 5. High-speed production: the solder ball jetting technology can quickly and accurately deposit materials, significantly improve production efficiency, be suitable for large-scale automatic production, and help reduce production costs; 6. Reduce contact pollution: non-contact operation reduces physical contact, reduces the risk of pollution and oxidation, and ensures the quality of welding points; 7. Adapt to complex structures: solder ball jetting technology can easily cope with complex connection structures and high-density packaging, and adapt to different design requirements, and output elasticity is better; 8. Simple steps: Because the steps of solder ball jetting connection, wire bonding and cutting are completed at one station in the manufacturing process, there is no need for printing, dispensing, welding and baking at multiple stations, which can greatly save the manufacturing time and complexity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor packaging method, comprising:

providing a chip;

providing a wire placed above a first connection pad of the chip; and performing a solder ball jetting step, jetting a first solder ball onto the chip and electrically connecting with the first connection pad of the chip, wherein the first solder ball contacts the wire, but the wire does not directly contact a surface of the first connection pad of the chip, wherein the solder ball jetting step comprises: providing a jetting head, wherein the jetting head is located above the first connection pad; sending the first solder ball to an outlet of the jetting head; and melting the first solder ball with a laser, and jetting the melted first solder ball onto the chip with a compressed gas.

2. The semiconductor packaging method according to claim 1, wherein the melted first solder ball is still in a molten state when jetted onto the chip, and the wire is surrounded by the molten first solder ball.

3. The semiconductor packaging method according to claim 1, wherein the wire is provided by a feeder.

4. The semiconductor packaging method according to claim 3, wherein after the first solder ball is jetted on the chip, one end of the wire is fixed on the chip.

5. The semiconductor packaging method according to claim 4, further comprising a substrate, the chip is located on the substrate, wherein after the first solder ball is jetted on the chip, the feeder is moved, and the other end of the wire is stopped at a second connection pad of the substrate.

6. The semiconductor packaging method according to claim 5, wherein after the feeder moves, the jetting head also moves above the second connection pad of the substrate, jets a second solder ball to the second connection pad, and the other end of the wire contacts the second solder ball.

7. The semiconductor packaging method according to claim 6, wherein after the other end of the wire contacts the second solder ball, the wire is cut off.

8. The semiconductor packaging method according to claim 1, wherein the chip is a power semiconductor chip including an insulated gate bipolar transistor (IGBT) chip or a metal oxide field effect transistor (MOSFET) chip.

9. The semiconductor packaging method according to claim 1, wherein the material of the wire comprises copper or aluminum.

10. The semiconductor packaging method according to claim 1, wherein the method does not include performing an ultrasonic wire bonding step.

11. The semiconductor packaging method according to claim 1, wherein the first connection pad on the chip comprises an electroplated nickel/immersion gold pad.

12. A semiconductor package structure produced by the semiconductor packaging method of claim 9.

* * * * *